United States Patent
Basker et al.

(10) Patent No.: US 9,608,069 B1
(45) Date of Patent: Mar. 28, 2017

(54) SELF ALIGNED EPITAXIAL BASED PUNCH THROUGH CONTROL

(71) Applicant: INTERNATIONAL BUSINESS MACHINES CORPORATION, Armonk, NY (US)

(72) Inventors: Veeraraghavan S. Basker, Schenectady, NY (US); Zuoguang Liu, Schenectady, NY (US); Tenko Yamashita, Schenectady, NY (US); Chun-Chen Yeh, Clifton Park, NY (US)

(73) Assignee: Intenational Business Machines Corporation, Armonk, NY (US)

( * ) Notice: Subject to any disclaimer, the term of this patent is extended or adjusted under 35 U.S.C. 154(b) by 0 days.

(21) Appl. No.: 15/097,741

(22) Filed: Apr. 13, 2016

(51) Int. Cl.
| H01L 21/00 | (2006.01) |
| H01L 27/00 | (2006.01) |
| H01L 29/00 | (2006.01) |
| H01L 29/10 | (2006.01) |
| H01L 29/08 | (2006.01) |
| H01L 29/16 | (2006.01) |
| H01L 29/161 | (2006.01) |

(Continued)

(52) U.S. Cl.
CPC .. H01L 29/1083 (2013.01); H01L 21/823807 (2013.01); H01L 21/823814 (2013.01); H01L 21/823821 (2013.01); H01L 27/0924 (2013.01); H01L 29/0847 (2013.01); H01L 29/161 (2013.01); H01L 29/165 (2013.01); H01L 29/1608 (2013.01); H01L 29/66545 (2013.01); H01L 29/66636 (2013.01); H01L 29/7848 (2013.01)

(58) Field of Classification Search
CPC ..... H01L 21/823821; H01L 21/823807; H01L 21/823814; H01L 27/0924; H01L 27/0886; H01L 27/1211; H01L 29/1083; H01L 29/7848; H01L 29/1608; H01L 29/161; H01L 29/165; H01L 29/66636; H01L 29/0847; H01L 29/66545
See application file for complete search history.

(56) References Cited

U.S. PATENT DOCUMENTS

| 7,317,218 B2 | 1/2008 | Tanaka et al. |
| 8,592,264 B2 | 11/2013 | Ando et al. |

(Continued)

FOREIGN PATENT DOCUMENTS

| CA | 1189981 A1 | 7/1985 |
| CN | 101819994 A | 9/2010 |

(Continued)

*Primary Examiner* — Nikolay Yushin
(74) *Attorney, Agent, or Firm* — Tutunjian & Bitetto, P.C.; Vazken Alexanian (57) ABSTRACT

A method of forming a semiconductor device that may include etching source and drain portions of a fin structure of a first semiconductor material selectively to an underlying semiconductor layer of a second semiconductor material, and laterally etching undercut region in the semiconductor layer underlying the fin structure. The method may further include filling the undercut region with a first conductivity type semiconductor material, and forming a second conductivity type semiconductor material for a source region and a drain region on opposing sides of the channel region portion of the fin structure.

20 Claims, 8 Drawing Sheets

(51) Int. Cl.
*H01L 29/165* (2006.01)
*H01L 29/78* (2006.01)
*H01L 27/092* (2006.01)
*H01L 21/8238* (2006.01)
*H01L 29/66* (2006.01)

(56) References Cited

U.S. PATENT DOCUMENTS

| | | | |
|---|---|---|---|
| 8,610,201 | B1 | 12/2013 | Hokazono |
| 8,932,918 | B2 | 1/2015 | Cheng et al. |
| 8,993,382 | B2 | 3/2015 | Cheng et al. |
| 8,999,774 | B2 | 4/2015 | Cheng et al. |
| 9,082,853 | B2 | 7/2015 | Cheng et al. |
| 9,112,057 | B1 | 8/2015 | Pradhan et al. |
| 9,263,549 | B2 * | 2/2016 | Rodder ............ H01L 29/66537 |
| 2010/0163971 | A1 | 7/2010 | Hung et al. |
| 2014/0061794 | A1 | 3/2014 | Cheng et al. |
| 2014/0312393 | A1 * | 10/2014 | Rodder ............ H01L 29/66537 257/288 |
| 2015/0054033 | A1 | 2/2015 | Cheng et al. |
| 2015/0295046 | A1 | 10/2015 | Cheng et al. |
| 2015/0303192 | A1 | 10/2015 | Zhu |
| 2015/0303284 | A1 | 10/2015 | Basker et al. |

FOREIGN PATENT DOCUMENTS

| | | | |
|---|---|---|---|
| KR | 20030070329 | A2 | 8/2003 |
| WO | 2014/035556 | A1 | 3/2014 |

* cited by examiner

SELF ALIGNED EPITAXIAL BASED PUNCH THROUGH CONTROL

BACKGROUND

Technical Field

The present disclosure relates to semiconductor devices, such as semiconductor devices including fin structures. The present disclosure further relates to processing of fin including structures that include punch through stop regions.

Description of the Related Art

The dimensions of semiconductor field effect transistors (FETs) have been steadily shrinking over the last thirty years or so, as scaling to smaller dimensions leads to continuing device performance improvements. Planar FET devices typically have a conducting gate electrode positioned above a semiconducting channel, and electrically isolated from the channel by a thin layer of gate oxide. Current through the channel is controlled by applying voltage to the conducting gate. With conventional planar FET scaling reaching fundamental limits, the semiconductor industry is looking at more unconventional geometries that will facilitate continued device performance improvements. One such class of device is a fin field effect transistor (FinFET).

SUMMARY

In one aspect, a method of forming a semiconductor device including a fin structure and employing a punch through stop region is provided. In one embodiment, the method includes etching source and drain portions of a fin structure of a first semiconductor material selectively to an underlying semiconductor layer of a second semiconductor material. The source and drain region portions are on opposing sides of a channel region portion of the fin structure. The method may further include laterally etching undercut region in the semiconductor layer underlying the fin structure; and filling the undercut region with a first conductivity type semiconductor material. The method may also include forming a second conductivity type semiconductor material for a source region and a drain region on opposing sides of the channel region portion of the fin structure.

In another embodiment, the method of forming the semiconductor device may include forming a gate structure on a channel portion of a silicon containing fin structure; and removing a portion of the silicon containing fin structure extending past the channel portion on opposing sides of the gate structure selectively to an underlying germanium containing layer. The method may further include laterally etching the undercut region in the germanium containing layer underlying the silicon containing fin structure, and filling the undercut region with a first conductivity type semiconductor material. In a following step, a second conductivity type semiconductor material can be formed for a source region and a drain region on opposing sides of the channel region portion of the fin structure.

In another aspect of the present disclosure, a semiconductor device is disclosed including a fin structure and a punch through stopper region. In one embodiment, the semiconductor device may include a gate structure present on a channel region of a fin structure, wherein the fin structure is composed of a first semiconductor material type and is present atop a semiconductor layer of a second semiconductor material type having a first concentration of a first conductivity type dopant. The semiconductor device may further include a punch through stop region comprising said second semiconductor material type and having said first conductivity type dopant in a concentration greater than the first conductivity type dopant in the semiconductor layer. The punch through stop region is composed of epitaxial material filling an undercut region extending into the semiconductor material underlying the fin structure. Source and drain regions composed of epitaxial semiconductor material of the first semiconductor material type is present on opposing sides of the channel region and atop the punch through stop region. The source and drain regions are doped to a second conductivity type.

BRIEF DESCRIPTION OF DRAWINGS

The following detailed description, given by way of example and not intended to limit the disclosure solely thereto, will best be appreciated in conjunction with the accompanying drawings, wherein like reference numerals denote like elements and parts, in which.

DETAILED DESCRIPTION OF THE PREFERRED EMBODIMENTS

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The terms "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

In some embodiments, the methods and structures disclosed herein form a FinFET semiconductor device including a punch through stop region. A field effect transistor (FET) is a semiconductor device in which output current, i.e., source-drain current, is controlled by the voltage applied to a gate structure to the semiconductor device. A field effect transistor has three terminals, i.e., gate structure, source region and drain region. As used herein, a "fin structure" refers to a semiconductor material, which is employed as the body of a semiconductor device, in which the gate structure is positioned around the fin structure such that charge flows down the channel on the two sidewalls of the fin structure and optionally along the top surface of the fin structure. A FinFET is a semiconductor device that positions the channel region of the semiconductor device in a fin structure. The source and drain regions of the fin structure are the portions of the fin structure that are on opposing sides of the channel region of the fin structure.

It has been determined that as gate pitch scaling and channel length shrinking in FinFET technology continues towards 10 nm, 7 nm, and 5 nm nodes, punch-through can happen if punch-through stopper is not properly applied. Punch-though in NFET is particularly prominent and becomes a severe issue in normal device operation. It has been determined that conventional punch through stop region forming techniques have a number of deficiencies. For example, deep ion implantation of certain species for p-type or n-type dopants (for example boron (B) for NFET) below a channel region or using a spin-on liner containing p-type or n-type dopants to form the punch through stopper liner is very hard to control, require difficult patterning development, and have side effects on p-type field effect transistors (pFETs). The methods and structures disclosed herein achieve self-aligned epitaxial-based punch through control for field effect transistors, such as n-type field effect transistors (nFETs). Epitaxial semiconductor material or epitaxial-based material is semiconductor material that is formed using an epitaxially deposition/epitaxial growth. "Epitaxial growth and/or deposition" means the growth of a semiconductor material on a deposition surface of a semiconductor material, in which the semiconductor material being grown has substantially the same crystalline characteristics as the semiconductor material of the deposition surface. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, an epitaxial film deposited on a {100} crystal surface will take on a {100} orientation.

As will be further described herein, the epitaxial based punch through stop region is an epitaxial based material that has a better quality than punch through stop regions formed by ion implantation and dopant introduced using spin no materials and thermal diffusion. Because the epitaxial based material of the punch through stop region is epitaxially formed on undercut regions extending underlying a fin structure, in which the source and drain regions are epitaxially formed atop the epitaxial based punch through stop region, the epitaxial based punch through stop region that is disclosed herein is a self-aligned structure. Further, because epitaxial doping methods are generally better for dopant diffusion control that implantation methods, the epitaxial punch through stop region formed by the methods of the present disclosure contributes to enhanced device uniformity. The methods and structures of the present disclosure are now described with greater detail referring to FIGS. 1-8.

Figure 1:
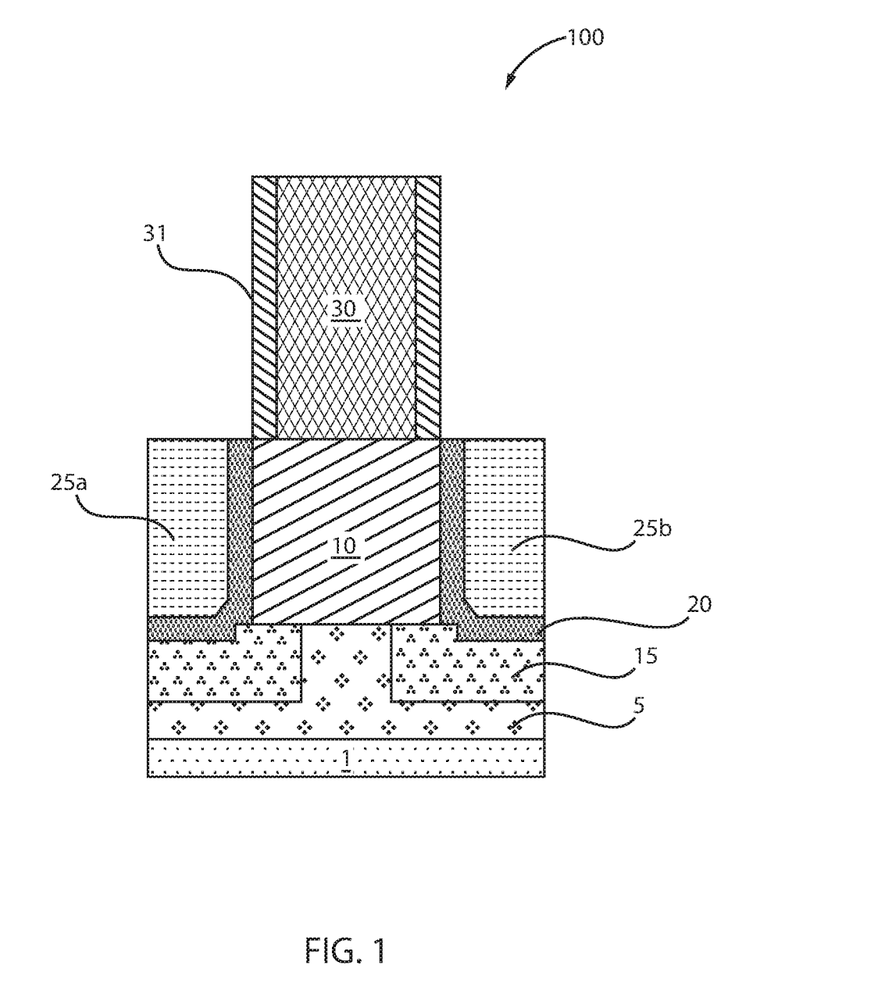
FIG. 1 is a side cross-sectional view of a semiconductor device including a fin structure and a punch through stopper region, in accordance with one embodiment of the present disclosure.

FIG. 1 depicts one embodiment of a semiconductor device 100 including a fin structure 10 and a punch through stop region 15. The punch through stop region 15 is present underlying the source and drain regions 35a, 35b and functions as an electrical barrier that obstructs charger carriers from diffusing from the active device, e.g., source and drain region 35a, 35b into the portion of the substrate 1 that is underlying the punch through stop region 15. In some embodiments, the punch through stop region 15 can reduce leakage in the device. The pinch through stopper creates a strong PN junction between the source/drain and the punch through stopper region (e.g. substrate) thus the source-to-drain leakage is significantly reduced when the device is at OFF state. The punch through stop region 15 is composed of an epitaxially formed semiconductor material that is formed in undercut regions etched into a semiconductor layer 5, e.g., well region 5, that is underlying a channel portion of a fin structure 10. A buffer layer 20 is formed on upper surfaces of the punch through stop region 15 and sidewalls of the channel portion of the fin structure 10. Similar to the punch through stopper region 15, the buffer layer 20 may be composed of an epitaxial semiconductor material. Source and drain regions 25a, 25b may be epitaxially formed on the buffer layer 20. Because the source and drain regions 25a, 25b are epitaxially formed on the buffer layer 20 and the buffer layer is epitaxially formed on the epitaxial punch through stop region 15 these structures are self-aligned to one another. Further, because the epitaxial punch through stop region 15 is formed in undercut regions selectively etched into a well region, i.e., semiconductor layer 5, to undercut a portion of the channel portion of the fin structure 10, the epitaxial punch through stop region 15 is self-aligned with the channel portion of the fin structure 10. In some embodiments, the punch through stop region 15 is present extending beneath the fin structure 10 underlying the gate structure 30 on both sides of the gate structure 30, but the opposing portions of the punch through stop region 15 do not extend across an entirety of a width of the semiconductor layer underlying the gate structure 30.

In some embodiments, the fin structure 10 is composed of a first semiconductor material type and is present atop a semiconductor layer 5 of a second semiconductor material type. The semiconductor layer 5 may have a first concentration of a first conductivity type dopant. The punch through stop region 15 may be composed of a second semiconductor material type that is doped with the first conductivity type dopant in a concentration greater than the first conductivity type dopant in the semiconductor layer 5. The punch through stop region 15 is composed of epitaxial material filling an undercut region extending into the semiconductor material underlying the fin structure 10. A gate structure 30 is present on a channel region of a fin structure 10; and source and drain regions 25a, 25b composed of epitaxial semiconductor material of said first semiconductor material type is present on opposing sides of said channel region and atop said punch through stop region 15. The source and drain regions 25a, 25b doped to a second conductivity type. The fin structure 10 may be composed of a first semiconductor material that may be silicon (Si), while the second semiconductor material of the semiconductor layer 5 that the fin structure 10 is present on may be a germanium containing material, such as silicon germanium (SiGe). The punch through stop region 15 is also composed of the second semiconductor material, in which the punch through stop region 15 is composed of an epitaxially formed semiconductor material. For example, similar to the semiconductor layer 5, the punch through stop region 15 may be composed of a germanium containing material, such as silicon germanium (SiGe).

The term "conductivity type" denotes whether are region of the device is doped to an n-type or p-type conductivity. For example, the second conductivity type of the source and drain regions 25a, 25b can be n-type, while the first conductivity type of the punch through stop region 15, as well as the semiconductor layer 5 that the fin structure 10 is present on, is p-type. In another example, the second conductivity type of the source and drain regions 25a, 25b can be p-type, while the first conductivity type of the punch through stop region 20, as well as the semiconductor layer 5 that the fin structure 10 is present on, is n-type. As used herein, "p-type" refers to the addition of impurities to an intrinsic semiconductor that creates deficiencies of valence electrons. In a type IV semiconductor, such as a silicon-containing semiconductor material, examples of n-type dopants, i.e., impurities, include but are not limited to: boron, aluminum, gallium and indium. As used herein, "n-type" refers to the addition of impurities that contributes free electrons to an intrinsic semiconductor. In a type IV semiconductor, such as a silicon containing semiconductor material, examples of n-type dopants, i.e., impurities, include but are not limited to antimony, arsenic and phosphorous.

The concentration of the dopant that dictates the conductivity type of the punch through stop region 15 is typically greater than the concentration of the dopant that provides the conductivity type of the semiconductor layer 5. The semiconductor layer 5 may also be referred to as a well region. For example, the dopant that provides the conductivity type of the punch through stop region 15 may be a p-type dopant, e.g., boron (B), present in a concentration region ranging from $10^{19}$ atoms/cm$^3$ to $10^{21}$ atoms/cm$^3$, while the dopant that provides the conductivity type of the semiconductor layer 5 (also referred to as well region) may be a p-type dopant, e.g., boron (B), present in a concentration ranging from $10^{17}$ atoms/cm$^3$ to mid $10^{18}$ atoms/cm$^3$.

The buffer layer 20 may be present on an upper portion of the punch through stop region 15 and a sidewall of the fin structure 10, i.e., channel portion of the fin structure 10, on opposing sides of the gate structure 30. The buffer layer 20 may be composed of an epitaxially formed semiconductor material. The buffer layer 20 may be composed of the silicon containing semiconductor material type. For example, the buffer layer 20 may be composed of epitaxially formed silicon doped with carbon (Si:C). In some embodiments, the carbon (C) dopants in the silicon (Si) base material of the buffer layer 20 can decrease the chance of any diffusion of the dopants in the punch through stop region 15 to the source/drain regions 25a, 25b. Additionally, the dopants in the source and drain regions 25a, 25b are counter doped to the dopants in the punch through stop region 15. Silicon doped with carbon as the material for the buffer layer 20 is also helpful for short channel control of the epitaxially formed silicon doped with phosphorus source and drain region 25a, 25b to the channel in reducing the phosphorus diffusion to the channel region. Further, a punch through stop region 15 composed of silicon germanium (SiGe) has a similar lattice structure to a semiconductor substrate 1 composed of silicon germanium (SiGe), thus facilitating growth of the thin punch through stopper SiGe on substrate 1. The buffer layer 20 is typically doped to a conductivity type, i.e., second conductivity type, opposite the conductivity type of the punch through stop region 15. For example, if the punch through stop region 15 is doped to a p-type conductivity, the buffer layer 20 is doped to an n-type conductivity; and if the punch through stop region 15 is doped to an n-type conductivity, the buffer layer 20 is doped to a p-type conductivity. The buffer layer can also be kept un-doped in some cases. In some embodiments, the dopant concentration for providing the second conductivity type in the buffer layer 20 is less than a dopant concentration for providing the second conductivity type in the source and drain regions 25a, 25b. For example, when the semiconductor device is an n-type device, and the source and drain regions 25a, 25b are doped to a n-type conductivity, the n-type dopant, e.g., phosphorus (P), may be present in the source and drain regions 25a, 25b at a concentration ranging from $1 \times 10^{19}$ atoms/cm$^3$ to $1 \times 10^{21}$ atoms/cm$^3$, and the n-type dopant, e.g., phosphorus (P), may be present in the buffer layer 20 in a concentration ranging from being un-doped to having a dopant concentration of $1 \times 10^{19}$ atoms/cm$^3$. It is noted that similar concentrations may be employed when the source and drain regions 25a, 25b are doped to a p-type conductivity, and the buffer layer 20 is doped to a p-type conductivity. The buffer layer is to control the dopants in the source/drain from diffusing into the channel region, thus control the short channel effect—turn-on at very low gate bias and hard to turn off due to source-channel-drain leakage at OFF state. The buffer layer also prevents the dopant in the punch through stopper from diffusing into the source-drain to counter dope the source-drain Source and drain regions 25a, 25b may be present on opposing sides of the channel portion of the fin structure 10. As used herein, the term "source" is a doped region in the semiconductor device, in which majority carriers are flowing into the channel. As used herein, the term "channel" is the region underlying the gate structure 30, e.g., channel portion of the fin structure 10, and between the source and drain 25a, 25b of a semiconductor device that becomes conductive when the semiconductor device is turned on. As used herein, the term "drain" means a doped region in semiconductor device located at the end of the channel, in which carriers are flowing out of the transistor through the drain.

The source and drain regions 25a, 25b are typically doped with a conductivity type dopant that dictates the conductivity type of the device. For example, when the source and drain regions 25a, 25b are doped to an n-type conductivity, the semiconductor device is an n-type device, such as an n-type field effect transistor (nFET), e.g., n-type FinFET. In another example, when the source and drain regions 25a, 25b are doped to a p-type conductivity, the semiconductor device is a p-type device, such as a p-type field effect transistor (nFET), e.g., n-type FinFET.

The source and drain regions 25a, 25b are typically epitaxially formed on the buffer layer 20, wherein the buffer layer 20 has been epitaxially formed on the punch through stop region 15. Therefore, the source and drain regions 25a, 25b are self-aligned with the buffer layer 20 and the punch through stop region 15.

In some embodiments, the source and drain regions 25a, 25b may be composed of a silicon containing material. For example, the source and drain regions may be composed of silicon (Si). In other embodiments, the source and drain regions 25a, 25b are composed of a silicon carbon alloy (e.g., silicon doped with carbon (Si:C), silicon germanium, a silicon germanium and carbon alloy (e.g., silicon germanium doped with carbon (SiGe:C), silicon alloys, germanium, germanium alloys, gallium arsenic, indium arsenic, indium phosphide, as well as III/V and II/VI compound semiconductors.

In one example, when the semiconductor device is an n-type field effect transistor (n-type FET), such as an n-type Fin Field Effect Transistors (n-type FinFET), the source and drain regions 25a, 25b may be composed of silicon doped with carbon (Si:C), in which the n-type dopant is phosphorus.

Referring to FIG. 1, a gate structure 30 may be present on the channel portion of the fin structure 10. The gate structure 30 operates to switch the semiconductor device from an "on" to "off" state, and vice versa. The gate structure 30 typically includes at least on gate dielectric and at least one gate conductor. In one embodiment, the at least one gate dielectric includes, but is not limited to, an oxide, nitride, oxynitride and/or silicates including metal silicates, aluminates, titanates and nitrides. In one example, when the at least one gate dielectric is comprised of an oxide, the oxide may be selected from the group including, but not limited to, $SiO_2$, $HfO_2$, $ZrO_2$, $Al_2O_3$, $TiO_2$, $La_2O_3$, $SrTiO_3$, $LaAlO_3$, $Y_2O_3$ and mixture thereof.

The gate structure 30 may also include a gate conductor that is formed atop the at least one gate dielectric. The conductive material of the gate conductor may comprise polysilicon, SiGe, a silicide, a metal or a metal-silicon-nitride such as Ta—Si—N. Examples of metals that can be used as the gate conductor include, but are not limited to, Al, W, Cu, and Ti or other like conductive metals. Gate sidewall spacers 31, composed of a dielectric material, such as an oxide, e.g., silicon oxide, nitride or oxynitride material, may be present on the sidewalls of the gate structure. The structures depicted in FIG. 1 are now described with greater detail referring to a method for forming a semiconductor device, as depicted in FIGS. 2-8.

Figure 2:
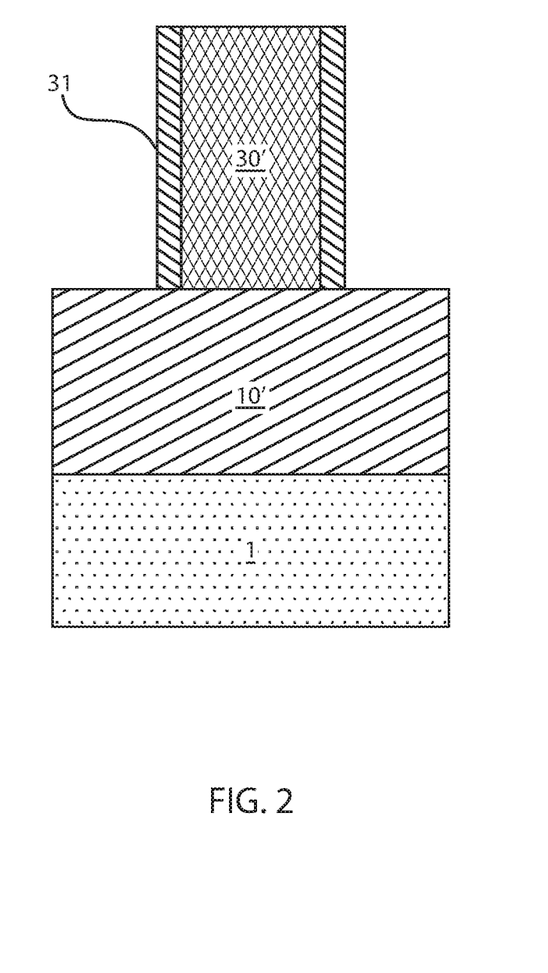
FIG. 2 is a side cross-sectional view of a gate structure formed atop a fin structure of a first semiconductor material that is overlying a semiconductor layer of a second semiconductor material, in accordance with one embodiment of the present disclosure.

FIG. 2 illustrates one embodiment of a sacrificial gate structure 30' formed atop a fin structure 10' of a first semiconductor material that is overlying a semiconductor substrate 1 of a second semiconductor material. In the embodiment depicted in FIG. 2, the semiconductor substrate 1 is composed of intrinsic semiconductor material, i.e., not an n-type or p-type doped material. In some embodiments, the semiconductor substrate 1 may be composed of a germanium containing semiconductor. For example, the semiconductor substrate 1 may be composed of silicon germanium (SiGe) including 25 at. % germanium (Ge).

The fin structure 10' are typically composed of a different semiconductor material than the semiconductor substrate 1. For example, when the semiconductor substrate 1 is composed of a germanium containing semiconductor, such as silicon germanium (SiGe), the fin structure 10' may be composed of silicon (Si). In some embodiments, the fin structure 10' may be formed from the semiconductor layer using photolithography and etch processes.

In one embodiment, the patterning process used to define the fin structure 10' is a sidewall image transfer (SIT) process. The SIT process can include forming a mandrel material layer (not shown) on the material layer that provides the fin structure 10, such as a silicon containing layer, e.g., silicon (Si) layer, that has been formed on the semiconductor substrate 1. The mandrel material layer can include any material (semiconductor, dielectric or conductive) that can be selectively removed from the structure during a subsequently performed etching process. In one embodiment, the mandrel material layer may be composed of amorphous silicon or polysilicon. In another embodiment, the mandrel material layer may be composed of a metal, such as, e.g., aluminum (Al), tungsten (W), or copper (Cu). The mandrel material layer can be formed by a deposition method, such as chemical vapor deposition or plasma enhanced chemical vapor deposition. In one embodiment, the thickness of the mandrel material layer can be from 50 nm to 300 nm. Following deposition of the mandrel material layer, the mandrel material layer can be patterned by lithography and etching to form a plurality of mandrel structures on the topmost surface of the semiconductor containing material that provides the fin structures 10, e.g., the SOI layer of an SOI substrate.

In some embodiments, the SIT process may continue by forming a dielectric spacer on each sidewall of each mandrel structure. The dielectric spacer can be formed by deposition of a dielectric spacer material, and then etching the deposited dielectric spacer material. The dielectric spacer material may comprise any dielectric spacer material such as, for example, silicon dioxide, silicon nitride or a dielectric metal oxide. Examples of deposition processes that can be used in providing the dielectric spacer material include, but are not limited to, chemical vapor deposition (CVD), plasma enhanced chemical vapor deposition (PECVD), or atomic layer deposition (ALD). Examples of etching that be used in providing the dielectric spacers include any etching process, such as, e.g., reactive ion etching (RIE). Since the dielectric spacers are used in the SIT process as an etch mask, the width of the each dielectric spacer determines the width of each fin structure that is formed by the SIT process. It is noted that although only one fin structure 10' is depicted in FIG. 2, the present disclosure may employ any number of fin structures being formed atop the semiconductor substrate 1.

In some embodiments, after formation of the dielectric spacers, the SIT process continues by removing each mandrel structure. Each mandrel structure can be removed by an etching process that is selective for removing the mandrel material as compared to silicon. Following the mandrel structure removal, the SIT process continues by transferring the pattern provided by the dielectric spacers into the semiconductor material layer that provides fin structure 10', such as silicon containing layer, e.g., silicon (Si) layer, which has been formed on the semiconductor substrate 1. The pattern transfer may be achieved by utilizing at least one etching process that can include dry etching, such as reactive ion etching (RIE), plasma etching, ion beam etching or laser ablation, chemical wet etch processes or a combination thereof. In one example, the etch process used to transfer the pattern may include one or more reactive ion etching (RIE) steps. The etching steps pattern the semiconductor material layer to provide the fin structure 10'. Following etching, i.e., pattern transfer, the SIT process may conclude with removing the dielectric spacers using an etch process or a planarization process.

It is noted that the aforementioned spacer image transfer (SIT) process is only one method of forming the fin structure 10'. In another embodiment, fin structures may be formed using a photoresist etch mask. Specifically, in one example, a photoresist mask is formed overlying the semiconductor composition layer which provides the fin structure 10'. The exposed portions of the semiconductor layer that provides the fin structure 10' that are not protected by the photoresist mask are removed using a selective etch process. To provide the photoresist mask, a photoresist layer is first positioned on the semiconductor layer that provides the fin structure 10', e.g., a silicon containing layer, e.g., silicon (Si) layer, which has been formed on the semiconductor substrate 1. The photoresist layer may be provided by a blanket layer of photoresist material that is formed utilizing a deposition process such as, e.g., plasma enhanced CVD (PECVD), evaporation or spin-on coating.

The blanket layer of photoresist material is then patterned to provide the photoresist mask utilizing a lithographic process that may include exposing the photoresist material to a pattern of radiation and developing the exposed photoresist material utilizing a resist developer. Following the formation of the photoresist mask, an etching process may remove the unprotected portions of the semiconductor layer that provides the fin structure 10'. The etch process may be an anisotropic process, such as reactive ion etch (RIE).

Referring to FIG. 2, the fin structure 10' may have a height ranging from 5 nm to 200 nm. In another embodiment, the fin structure 10' may have a height ranging from 10 nm to 100 nm. In one example, the fin structure 10' may have a height ranging from 20 nm to 50 nm. The fin structure 10' may have a width of less than 20 nm. In another embodiment, the fin structure 10' have a width ranging from 3 nm to 8 nm.

In some embodiments, the fin structure 10' may be composed of a silicon including material, which may include, but is not limited to silicon, single crystal silicon, multicrystalline silicon, polycrystalline silicon, amorphous silicon, strained silicon, silicon doped with carbon (Si:C), silicon alloys or any combination thereof. The fin structures 5 may also be composed of germanium including semiconductor materials, such as silicon germanium (SiGe) or germanium (Ge). The fin structures 10' may also be composed of a type III-V semiconductor material, such as gallium arsenide (GaAs).

FIG. 2 also depicted one embodiment of forming a sacrificial gate structure 30' on the channel portion of the fin structure 10'. The term "sacrificial" as used to describe the gate conductor structure depicted in FIG. 2 denotes that the structure is present during the process sequence, but is not present in the final device structure, in which the replacement structure provides an opening that dictates the size and geometry of a later formed functional gate conductor. The sacrificial material that provides the sacrificial gate structure 30' may be composed of any material that can be etched selectively to the underlying fin structure 10'. In one embodiment, the sacrificial material that provides the sacrificial gate structure 30' may be composed of a silicon-containing material, such as polysilicon. Although, the sacrificial gate structure 30' is typically composed of a semiconductor material, the sacrificial gate structure 30' may also be composed of a dielectric material, such as an oxide, nitride or oxynitride material, or amorphous carbon.

The sacrificial material may be patterned and etched to provide the sacrificial gate structure 30'. Specifically, and in one example, a pattern is produced by applying a photoresist to the surface to be etched, exposing the photoresist to a pattern of radiation, and then developing the pattern into the photoresist utilizing a resist developer. Once the patterning of the photoresist is completed, the sections if the sacrificial material covered by the photoresist are protected to provide the sacrificial gate structure 30', while the exposed regions are removed using a selective etching process that removes the unprotected regions. Following formation of sacrificial gate structure 30', the photoresist may be removed. At least one dielectric gate spacer 31 may then be formed on the sidewall of the sacrificial gate structure 30'. In one embodiment, the dielectric gate spacer 31 may be formed by using a blanket layer deposition, such as CVD, and an anisotropic etchback method. The dielectric gate spacer 31 may have a width ranging from 2.0 nm to 15.0 nm, and may be composed of a dielectric, such as a nitride, oxide, oxynitride, or a combination thereof.

Figure 3:
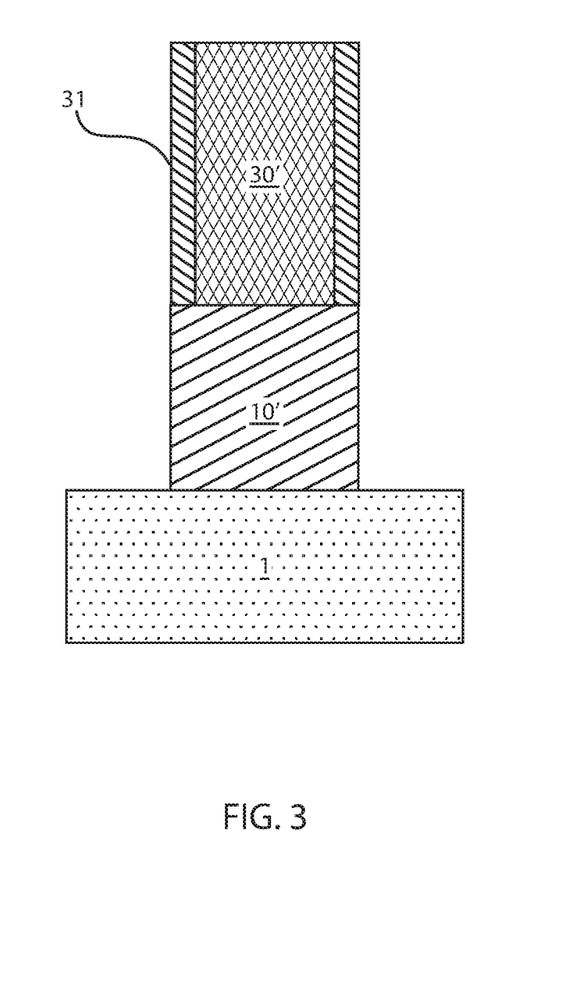
FIG. 3 is a side cross-sectional view of etching source and drain portions of a fin structure of a first semiconductor material selectively to the underlying semiconductor layer of the second semiconductor material, in accordance with one embodiment of the present disclosure.

FIG. 3 depicts one embodiment of removing the source and drain portions of a fin structure 10' selectively to the underlying semiconductor substrate 1 of the second semiconductor material. Following removal of the source and drain portions of the fin structure 10', the remaining portion of the fin structure 10 may be referred to as the channel portion of the fin structure 10. The source and drain region portions of the fin structure may be removed using an etch process, in which the sacrificial gate structure 30 may function as an etch mask to protect the channel portion of the fin structure 10. The source and drain region portions of the fin structures 10' may be removed with an anisotropic etch. As used herein, an "anisotropic etch process" denotes a material removal process in which the etch rate in the direction normal to the surface to be etched is greater than in the direction parallel to the surface to be etched. The anisotropic etch may include reactive-ion etching (RIE). Reactive Ion Etching (RIE) is a form of plasma etching in which during etching the surface to be etched is placed on the RF powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point of the present disclosure include ion beam etching, plasma etching or laser ablation. The etch process may also be timed and/or employ end point detection methods to determine when the etch process has removed the entirety of the source and drain region portions of the fin structures 10' expose an upper surface of the underlying semiconductor substrate 1. During the etch process, the channel portion of the fin structures 10 is protected by the sacrificial gate structure 10, as well as the gate sidewall spacers 11, or an etch mask that is formed over the channel portion of the fin structures.

Figure 4:
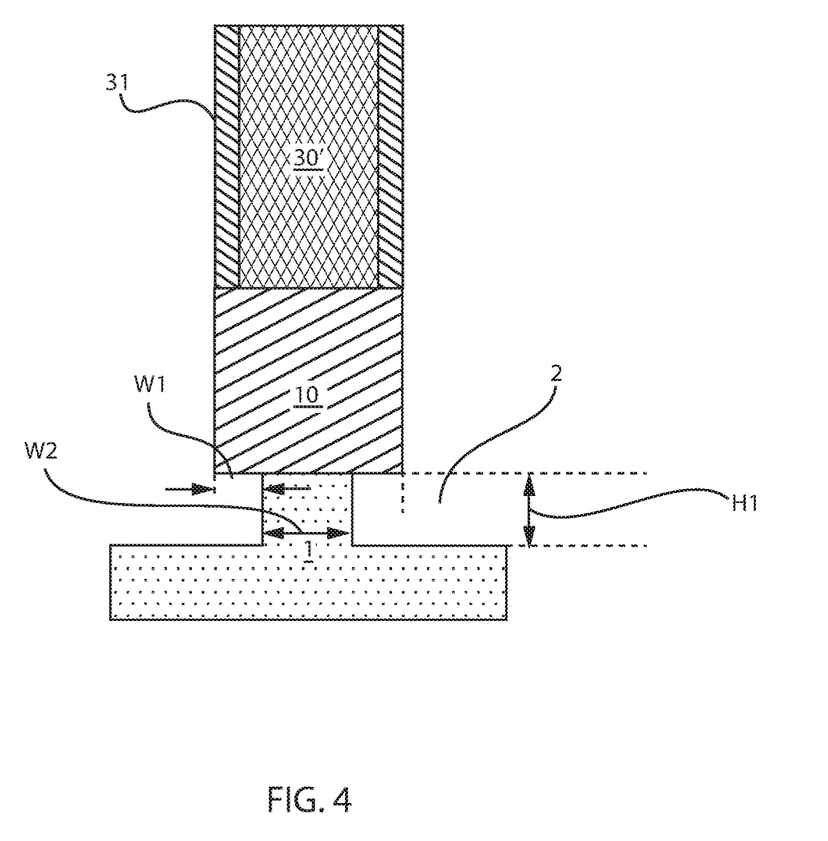
FIG. 4 is a side cross-sectional view of laterally etching undercut region in the semiconductor layer underlying the fin structure, in accordance with one embodiment of the present disclosure.

FIG. 4 depicts one embodiment of laterally etching undercut region 2 in the semiconductor substrate 1 underlying the remaining channel portion of the fin structure 10. In some embodiments, the lateral etch process for forming the undercut region 2 may include etching the semiconductor substrate 1 selectively to the fin structure 10. The term "selective" as used to describe a material removal process denotes that the rate of material removal for a first material is greater than the rate of removal for at least another material of the structure to which the material removal process is being applied. For example, in one embodiment, a selective etch may include an etch chemistry that removes a material of the semiconductor substrate 1 selectively to a remaining channel portion of the fin structure 10 by a ratio of 10:1 or greater, e.g., 100:1 or greater. For example, in one embodiment, in which the remaining channel portion of the fin structure 10 is composed of silicon (Si) and the semiconductor substrate 1 is composed of silicon germanium (SiGe) with 25 at. % germanium (Ge), the selective etch process for forming the undercut region may be a wet chemical etch with a hydrochloric (HCl) composition. In another example, the wet chemical etch for lateral etching the undercut regions 2 that are depicted in FIG. 5 includes a chemistry composed of hydrogen peroxide ($H_2O_2$).

After the lateral etching process, each undercut region 2 extends under the channel region portion of the fin structure 10 by a dimension W1 ranging from 2 nm to 10 nm, as measured from the etched sidewall of the channel region portion of the fin structure 10. In another embodiment, after the lateral etching process, each undercut region 2 extends under the channel region portion of the fin structure 10 by a dimension W1 ranging from 4 nm to 8 nm, e.g., 6 nm, as measured from the etched sidewall of the channel region portion of the fin structure 10. The remaining portion of the semiconductor substrate 1 that is positioned between the opposing undercut regions 2 may have a width W2 ranging from 5 nm to 15 nm. In one example, the remaining portion of the semiconductor substrate 1 has a width W2 that is equal to 8 nm. The height H1 of the lateral undercut region 2 that is present underlying the channel portion of the fin structure 10' may range from 2 nm to 10 nm. In one example, the height H1 of the lateral undercut region 2 ranges from 6 nm to 7 nm.

Figure 5:
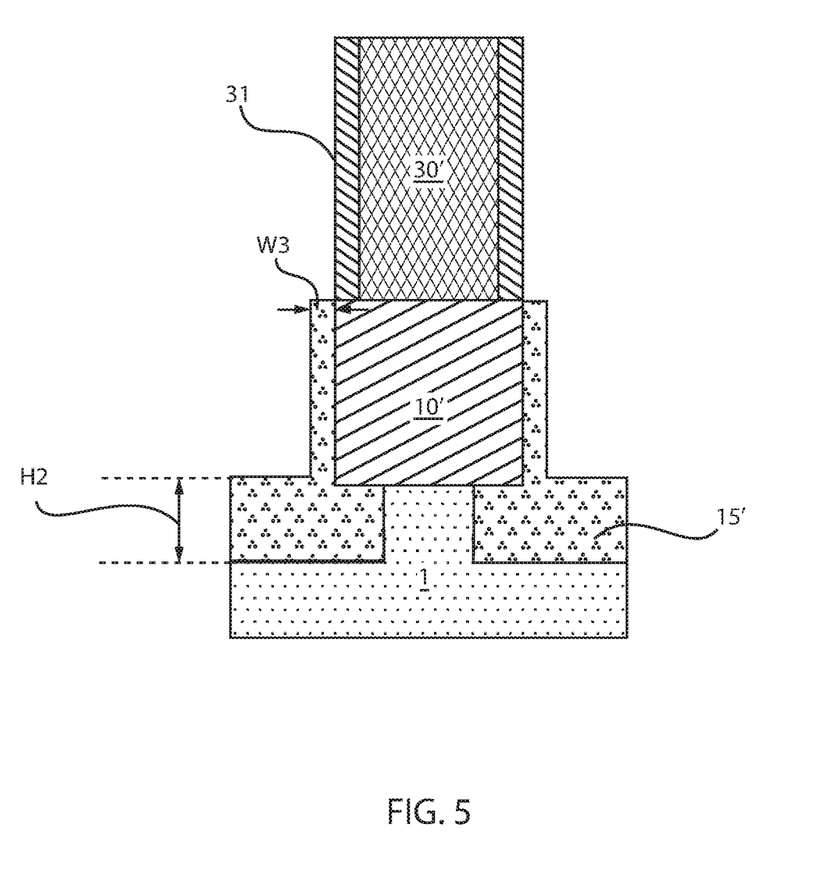
FIG. 5 is a side cross-sectional view depicting filling the undercut region with a first conductivity type semiconductor material, in accordance with one embodiment of the present disclosure.

FIG. 5 depicts one embodiment of filling the undercut region 2 with a first conductivity type semiconductor material to provide the punch through stop region 15. The punch trough stop region 15 is typically composed of epitaxially formed semiconductor material. The punch through stop region 15 is composed doped to a conductivity type that is opposite the conductivity type of the later formed buffer layer 20 and source and drain regions 25a, 25b. The epitaxial material for the punch through stop region 15 fills the undercut region 2 extending into the semiconductor material of the semiconductor substrate 1 that is underlying the channel portion of the fin structure 10.

In some embodiments, the punch through stop region 15 may be composed of silicon, a silicon carbon alloy (e.g., silicon doped with carbon (Si:C), silicon germanium, a silicon germanium and carbon alloy (e.g., silicon germanium doped with carbon (SiGe:C), silicon alloys, germanium, germanium alloys, gallium arsenic, indium arsenic, indium phosphide, as well as other III/V and II/VI compound semiconductors.

A number of different sources may be used for the epitaxial deposition of the punch through stop region 15. For example, a silicon including semiconductor material may be deposited from a silicon including source gas that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. Examples of germanium including source gasses for germanium including semiconductor materials include germane, digermane, halogermane, dichlorogermane, trichlorogermane, tetrachlorogermane and combinations thereof. The temperature for epitaxial deposition typically ranges from 450° C. to 900° C. Although higher temperature typically results in faster deposition, the faster deposition may result in crystal defects and film cracking.

In one embodiment, the punch through stop region 15 is formed of epitaxial silicon germanium (SiGe) in which the germanium (Ge) at. % ranges from 25 at. % to 60 at. %. The epitaxial material for the punch through stop region 15 selectively forms on the exposed semiconductor surfaces. For example, when the channel portion of the fin structure 10 is composed of silicon, the epitaxial silicon germanium (SiGe) for the punch through stop region 15 may be formed on the etched sidewalls, i.e., vertically orientated surfaces, of the fin structure 10 having the (110) crystalline orientation. For example, when the semiconductor substrate 1 is composed of silicon germanium (SiGe), the epitaxial silicon germanium (SiGe) for the punch through stop region 15 may be formed on the etched undercut regions 2 of the semiconductor substrate including base surfaces, i.e., horizontally orientated surfaces, of the undercut regions 2 the having the (100) crystalline orientation. The thickness W3 of the epitaxial silicon germanium (SiGe) that is formed on the etched sidewalls of the channel portion of the silicon fin structure 10 having the (110) crystalline orientation is less than the thickness H2 of the epitaxial silicon germanium (SiGe) that is formed on the base surfaces of the undercut regions 2 in the silicon germanium semiconductor substrate 1 having the (100) crystalline orientation. For example, the thickness W3 of the epitaxial silicon germanium (SiGe) for the punch through stop region 15 on the etched sidewall surfaces of the channel portion of the fin structure 10 may be on the order of 2 nm, while the thickness H2 of the epitaxial silicon germanium (SiGe) that is formed on the base surfaces of the undercut regions 2 in the silicon germanium semiconductor substrate 1 may be greater (an overfill deposition) than the height of the undercut regions, which can be on the order of 6 nm to 7 nm.

The epitaxial semiconductor material for the punch through stop region 15 may have a high dopant concentration of conductivity type dopant that is opposite the conductivity type of the later formed source and drain regions 25a, 25b. The dopant that dictates the conductivity type of the punch through stop region 15 may be implanted into the epitaxial semiconductor material that provides the punch through stop region 15 in situ. The term "in situ" denotes that the dopant, e.g., n-type or p-type dopant, is introduced to the base semiconductor material, e.g., silicon or silicon germanium, during the formation of the base material. For example, an in situ doped epitaxial semiconductor material may introduce n-type or p-type dopants to the material being formed during the epitaxial deposition process that includes n-type or p-type source gasses. In one embodiment, the n-type gas dopant source may include arsine ($AsH_3$), phosphine ($PH_3$) and alkylphosphines, such as with the empirical formula $R_xPH_{(3-x)}$, where R=methyl, ethyl, propyl or butyl and x=1, 2 or 3. Alkylphosphines include trimethylphosphine (($CH_3)_3P$), dimethylphosphine (($CH_3)_2PH$), triethylphosphine (($CH_3CH_2)_3P$) and diethylphosphine (($CH_3CH_2)_2PH$). The p-type gas dopant source may include diborane ($B_2H_6$).

The dopant concentration of the n-type or p-type dopant may be present in the epitaxial semiconductor material that provides the punch through stop region 15 in a concentration ranging from $1 \times 10^{19}$ dopants/$cm^3$ to $5 \times 10^{21}$ dopants/$cm^3$. In one example, the punch through stop region 15 is composed of silicon germanium that is doped with boron (B) in a concentration ranging from $1 \times 10^{20}$ dopants/$cm^3$ to $5 \times 10^{20}$ dopants/$cm^3$.

Figure 6:
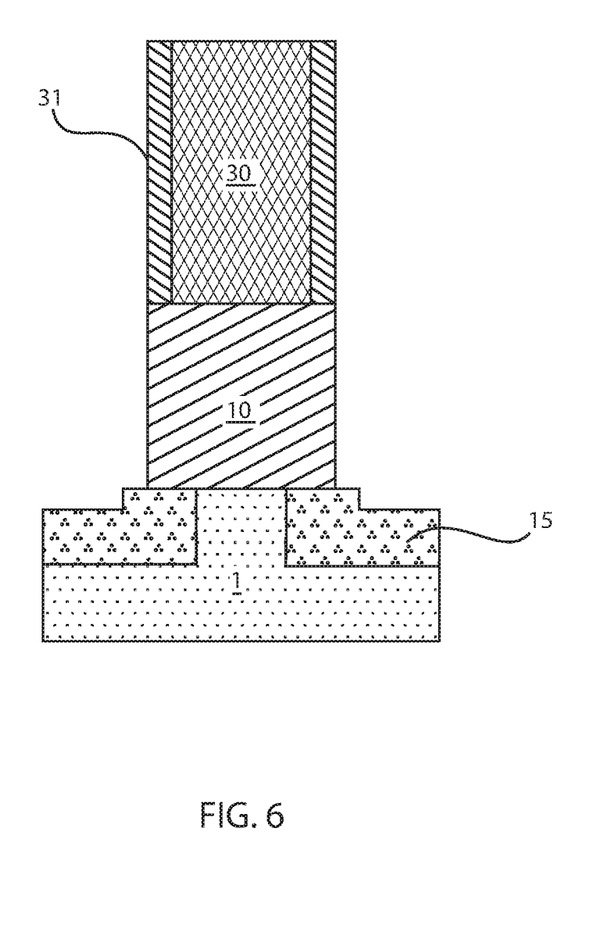
FIG. 6 is a side cross-sectional view depicting an etch step for removing the portions of the first conductivity type semiconductor material that were formed on the etched sidewalls of the fin structure.

FIG. 6 depicts one embodiment of an etch step for removing the portions of the epitaxial semiconductor material for the punch through stop region 15 that were formed on the etched sidewalls of the channel portion of the fin structure 10. The etch process for removing the portion of epitaxial semiconductor material formed on the etched sidewalls of the channel portion of the fin structure may also recess the portion of epitaxial semiconductor material that has been formed filling the undercut regions 2 within the semiconductor substrate 1. The etch process may be an isotropic, i.e., non-directional etch process, such as a wet chemical etch. In some embodiments, the etch process may be selective to the channel portion of the fin structure 10. In one example, the etch process for removing the epitaxial semiconductor material for the punch through stop region 15 from the sidewalls of the fin structure 10 may be comprised of hydrochloric acid (HCl). It is noted that the etch process for removing the epitaxial semiconductor material for the punch through stop region 15 from the sidewalls of the fin structure 10 is gentle so as to remove only 1 nm or 2 nm from the height H2 of the epitaxial semiconductor material in the undercut regions 2, so that the recessed height H2 of the epitaxial semiconductor material in the undercut regions 2 that provides the punch through stop region 15 is greater than the height H1 of the undercut regions 2.

Figure 7:
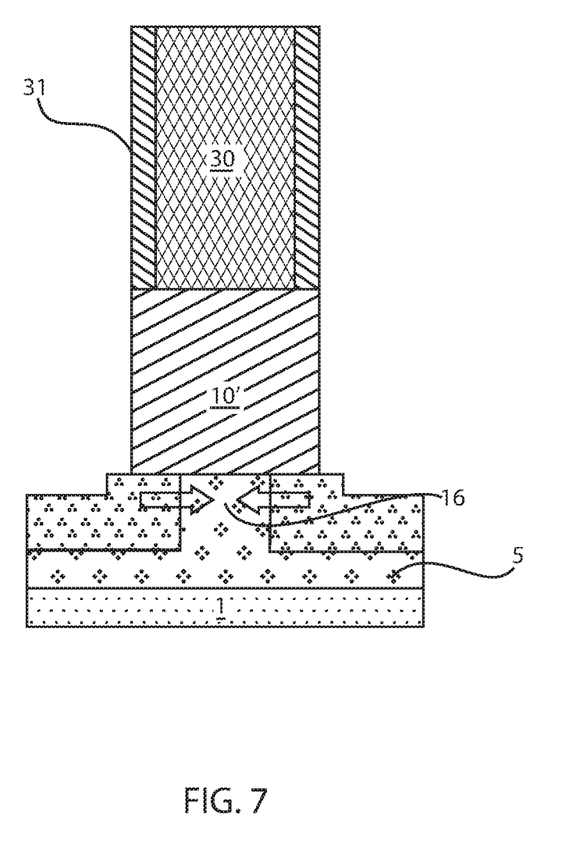
FIG. 7 is a side cross-sectional view depicting a thermal diffusion anneal, in accordance with one embodiment of the present disclosure.

FIG. 7 depicts a thermal diffusion anneal that diffused dopant from the punch through stop region into a portion of the semiconductor substrate 1 to form a well region 5, which has also been referred to herein as a semiconductor layer. The anneal may be referred to a drive in anneal. For example, boron (B) from the punch through stop region 15 may be driven by thermal diffusion into the undoped semiconductor substrate 1 that is composed of silicon germanium (SiGe) having a germanium (Ge) at. % of 25% particularly to the area of the semiconductor substrate 1 that is underlying the channel portion of the fin structure 10. For example, the boron (B) dopant from the punch through stop region 15 may be diffused laterally approximately 4 nm from the edge of the epitaxial material towards the portion of the semiconductor substrate 1 underlying the center of the channel region portion of the fin structure 10.

The thermal diffusion anneal may be provided by laser anneal, pulsed laser anneal, rapid thermal anneal, furnace anneal or a combination thereof. In some embodiments, the anneal temperature may be on the order of 900° C. to 1000° C. When laser annealing, the laser anneal pulse may be on the order of nanoseconds or microseconds. In some embodiments, the dopant concentration in the well region 5 may range from $1\times10^{19}$ dopants/cm$^3$ to $5\times10^{20}$ dopants/cm$^3$.

Figure 8:
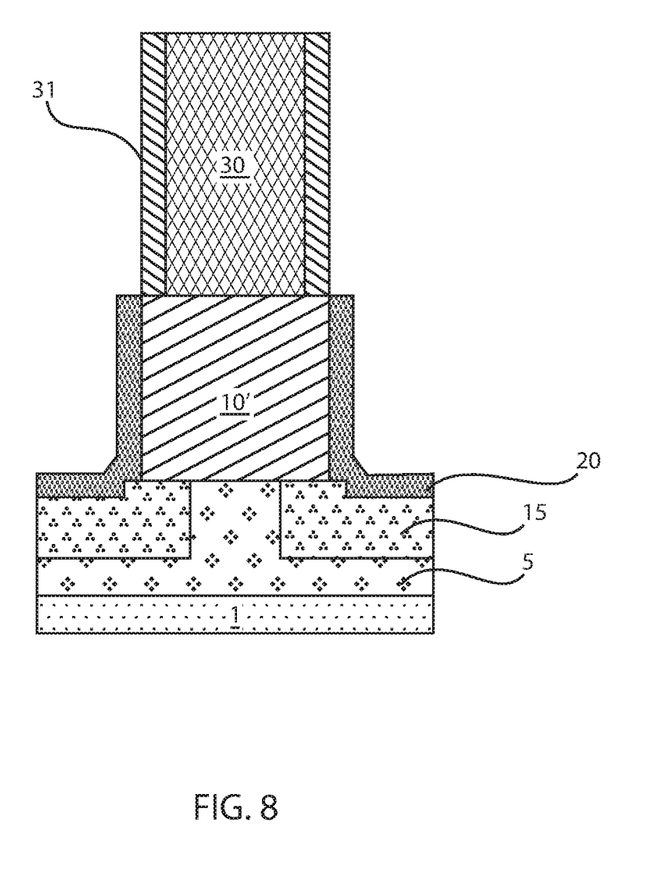
FIG. 8 is a side cross-sectional view depicting forming an epitaxial buffer layer on an upper surface of said first conductivity type semiconductor material, and on sidewalls of the fin structure, in accordance with one embodiment of the present disclosure.

FIG. 8 depicting forming an epitaxial buffer layer 20 on an upper surface of the epitaxial semiconductor material that provides the punch through stop region 15, and on sidewalls of the fin structure 10. The epitaxial buffer layer is typically composed of a silicon including material. In the embodiment that is depicted in FIG. 8, in which the punch through stop region 15 is composed of silicon germanium (SiGe) doped with boron (B), i.e., p-type doped, the epitaxial buffer layer 20 may be composed of silicon doped with carbon (Si:C) that is doped to an opposite conductivity type as the punch through stop region 15. For example, the Si:C of the epitaxial buffer layer have an n-type conductivity that has been provided by in situ doped phosphorus. The concentration of the dopant that dictates the conductivity type of the epitaxial buffer layer 20 may range from being undoped to $5\times10^{19}$ atoms/cm$^3$. The epitaxial deposition and in-situ doping processes used to provide the epitaxial buffer layer 20 are similar to the epitaxial deposition and in-situ doping processed used to form the punch through stop region 15. Therefore, further details regarding epitaxial deposition and in situ doping for forming the epitaxial buffer layer 20 can be found above in the description of the punch through stop region 15. The buffer layer is composed of a material and dopant conductivity type to control diffusion of charge carriers in the source and drain regions 25a, 25b.

Referring back to FIG. 1, the method may continue with forming source and drain regions 25a, 25b. The source and drain regions 25a, 25b are epitaxially formed in direct contact with the epitaxial buffer layer 20, and have the same conductivity type as the epitaxial buffer layer 20. In the example that is depicted in FIG. 1, the source and drain regions 25a, 25b are composed of silicon (Si) that is doped with n-type dopant, e.g., phosphorus (P), to provide an n-type field effect transistor (n-type FinFET). The dopant concentration of the n-type dopant may range from $1\times10^{16}$ dopants/cm$^3$ to $1\times10^{19}$ dopants/cm$^3$. In another example, the dopant concentration of the n-type dopant is approximately $1\times10^{18}$ dopants/cm$^3$.

It is noted that this is only one example, and is not intended to limit the present disclosure, as other compositions and conductivity types are also suitable for the source and drain regions 25a, 25b, as described above with referenced to FIG. 1. The epitaxial deposition and in-situ doping processes used to provide the source and drain regions 25a, 25b are similar to the epitaxial deposition and in-situ doping processed used to form the punch through stop region 15. Therefore, further details regarding epitaxial deposition and in situ doping for forming the source and drain regions 25a, 25b can be found above in the description of the punch through stop region 15.

The method may continue with replacing the sacrificial gate structure 30' with a functional gate structure 30. The "functional gate structure" operates to switch the semiconductor device from an "on" to "off" state, and vice versa. The functional gate structure 30 typically includes at least on gate dielectric and at least one gate conductor. Substituting the sacrificial gate structure 30' with a functional gate structure 30 may begin with forming an interlevel dielectric layer (not shown) overlying the structure, and planarizing the interlevel dielectric layer to be coplanar with an upper surface of the sacrificial gate structure 30'. The sacrificial gate structure 30' may then be removed by an etch that is selective to the fin structure 10 and the interlevel dielectric layer. The etch may also be selective to the gate sidewall spacers 31. Removing the sacrificial gate structure 30' provides a gate structure opening to the channel region portion of the fin structure 10. The functional gate structure 30 is formed in the gate structure opening.

The functional gate structure 30 may include at least one gate dielectric. The at least one gate dielectric may be formed using a deposition process, such as chemical vapor deposition (CVD). Examples of CVD processes for forming the at least one gate dielectric include chemical vapor deposition (CVD), plasma enhanced chemical vapor deposition (PECVD), physical vapor deposition (PVD), atomic layer deposition (ALD) and other like deposition processes. The at least one gate dielectric may also include material layers formed using a thermal growth process, such as thermal oxidation.

The functional gate structure 30 may also include a gate conductor that is formed atop the at least one gate dielectric. The layer of conductive material for the gate conductor may be doped or undoped. If doped, an in-situ doping deposition process may be employed. Alternatively, a doped conductive material can be formed by deposition, ion implantation and annealing. The at least one gate conductor may be formed using a deposition process. For example, when the at least one gate conductor is composed of a semiconductor material, the at least one gate conductor may be formed using a deposition process, such as chemical vapor deposition (CVD). In another embodiment, when the at least one gate conductor is composed of a metal, the at least one gate conductor is formed using a physical vapor deposition (PVD) process, such as sputtering. Examples of sputtering apparatus that may be suitable for depositing the at least one gate conductor include DC diode type systems, radio frequency (RF) sputtering, magnetron sputtering, and ionized metal plasma (IMP) sputtering.

In another embodiment, the process sequence for forming the FinFET structure depicted in FIGS. 1-8 is formed using a gate first process sequence, which is not depicted in the supplied figures. The method depicted in FIGS. 1-8 is a gate last process that includes forming a replacement gate structure. In another embodiment, a functional gate structure is formed instead of a replacement gate structure, and the functional gate structure remains throughout the formation of the fin structure. This is referred to as a gate first process sequence. Both gate first and gate last process sequences are applicable to the present disclosure.

The methods and structures that have been described above with reference to FIGS. 1-8 may be employed in any electrical device including integrated circuit chips. The integrated circuit chips including the disclosed structures and formed using the disclosed methods may be integrated with other chips, discrete circuit elements, and/or other signal processing devices as part of either (a) an intermediate product, such as a motherboard, or (b) an end product. The end product can be any product that includes integrated circuit chips, including computer products or devices having a display, a keyboard or other input device, and a central processor.

While the methods and structures of the present disclosure have been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A method of forming a semiconductor device comprising:
   etching source and drain portions of a fin structure of a first semiconductor material selectively to an underlying semiconductor layer of a second semiconductor material, wherein the source and drain region portions are on opposing sides of a channel region portion of the fin structure;
   laterally etching undercut region in the semiconductor layer underlying the fin structure;
   filling the undercut region with a first conductivity type semiconductor material; and
   forming a second conductivity type semiconductor material for a source region and a drain region on opposing sides of the channel region portion of the fin structure.

2. The method of claim 1, wherein the first semiconductor material comprises silicon and the second semiconductor material comprises silicon germanium.

3. The method of claim 1 further comprising forming a gate structure on the channel region portion of the fin structure.

4. The method of claim 3, wherein following said etching, a sidewall of the fin structure is aligned with gate sidewall of said gate structure.

5. The method of claim 1, wherein said etching said source and drain portions of the silicon containing fin structure comprises an isotropic etch.

6. The method of claim 1, wherein said filling the undercut region with the first conductivity type semiconductor material comprises epitaxial growth.

7. The method of claim 6, wherein a portion of the first conductivity type semiconductor material is epitaxially grown on the sidewall of the fin structure, wherein said method further comprises applying a wet etch to remove said portion of the first conductivity type semiconductor material formed on said sidewall of the fin structure.

8. The method of claim 1, further comprising a drive in anneal following formation of the first conductivity type semiconductor material.

9. The method of claim 1 further comprising forming an epitaxial buffer layer on an upper surface of said first conductivity type semiconductor material, and on said sidewalls of the fin structure, wherein the epitaxial buffer layer comprises said second conductivity.

10. The method of claim 9, wherein forming the forming of the second conductivity type semiconductor material for the source region and the drain region on opposing sides of the channel region portion of the fin structure comprises epitaxial growth on the epitaxial buffer layer, wherein a dopant concentration that dictates the second conductivity type in the epitaxial buffer layer is greater than a dopant concentration that dictates the second conductivity type in the source region and drain region.

11. A method of forming a semiconductor device comprising:
   forming a gate structure on a channel portion of a silicon containing fin structure;
   removing a portion of the silicon containing fin structure extending past said channel portion on opposing sides of said gate structure selectively to an underlying germanium containing layer;
   laterally etching undercut region in the germanium containing layer underlying the silicon containing fin structure;
   filling the undercut region with a first conductivity type semiconductor material; and
   forming a second conductivity type semiconductor material for a source region and a drain region on opposing sides of the channel region portion of the fin structure.

12. The method of claim 11, wherein the gate structure formed prior to removing said portion of the silicon containing fin structure is a sacrificial gate structure that is replaced with a functional gate structure after forming the second conductivity type semiconductor material for the source region and the drain region.

13. A semiconductor device comprising:
   a gate structure present on a channel region of a fin structure, wherein the fin structure is composed of a first semiconductor material type and is present atop a semiconductor layer of a second semiconductor material type having a first concentration of a first conductivity type dopant;
   a punch through stop region comprising said second semiconductor material type and having said first conductivity type dopant in a concentration greater than the first conductivity type dopant in the semiconductor layer, wherein said punch through stop region is composed of epitaxial material filling an undercut region extending into the semiconductor material underlying the fin structure; and
   source and drain regions composed of epitaxial semiconductor material of said first semiconductor material type is present on opposing sides of said channel region and atop said punch through stop region, the source and drain regions doped to a second conductivity type.

14. The semiconductor device of claim 13, wherein a buffer layer of said first semiconductor material type and having the second conductivity type is present on a upper portion of the punch through stop region and a sidewall of the fin structure on opposing sides of the gate structure.

15. The semiconductor device of claim 14, wherein a dopant concentration for provided said second conductivity type in said buffer layer is greater than a dopant concentration for providing said second conductivity type in said source and drain regions.

16. The semiconductor device of claim 15, wherein a dopant concentration that provides the first conductivity type for the punch through stop region is greater than a dopant concentration that provides the first conductivity type of the semiconductor layer.

17. The semiconductor device of claim 16, wherein the punch through stop region is present extending beneath the fin structure underlying the gate structure on both sides of the gate structure, but the opposing portions of the punch through stop region do not extend across an entirety of a width of the semiconductor layer underlying the gate structure.

18. The semiconductor device of claim 17, wherein the first semiconductor material type is silicon and the second semiconductor material type is silicon germanium.

19. The semiconductor device of claim 18, wherein the first semiconductor material type for the buffer layer further comprise carbon.

20. The semiconductor device of claim 19, wherein the first conductivity type is a p-type conductivity, and the second conductivity type is an n-type conductivity.

* * * * *